United States Patent
Chin et al.

(10) Patent No.: US 8,357,563 B2
(45) Date of Patent: Jan. 22, 2013

(54) STITCH BUMP STACKING DESIGN FOR OVERALL PACKAGE SIZE REDUCTION FOR MULTIPLE STACK

(75) Inventors: Lai Nguk Chin, Penang (MY); Foong Yue Ho, Penang (MY); Wong Kwet Nam, Penang (MY); Koo Eng Luon, Penang (MY); Sally Foong, Milpitas, CA (US); Kevin Guan, Richmond, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/853,856

(22) Filed: Aug. 10, 2010

(65) Prior Publication Data
US 2012/0038059 A1 Feb. 16, 2012

(51) Int. Cl.
*H01L 21/00* (2006.01)
(52) U.S. Cl. ........................ 438/107; 438/617
(58) Field of Classification Search .......... 438/612–616, 438/107–109
See application file for complete search history.

(56) References Cited

U.S. PATENT DOCUMENTS

| | | | |
|---|---|---|---|
| 7,148,576 B2* | 12/2006 | Nemoto | 257/781 |
| 7,285,854 B2* | 10/2007 | Ishikawa et al. | 257/738 |
| 7,932,131 B2* | 4/2011 | Foong et al. | 438/118 |
| 2003/0230796 A1 | 12/2003 | Ismail et al. | |
| 2007/0210436 A1 | 9/2007 | Filoteo, Jr. et al. | |
| 2009/0001599 A1* | 1/2009 | Foong et al. | 257/777 |
| 2009/0146283 A1 | 6/2009 | Chen et al. | |

FOREIGN PATENT DOCUMENTS

KR 20030095035 A 12/2003

\* cited by examiner

*Primary Examiner* — Richard A. Booth

(57) ABSTRACT

A method for die stacking is disclosed. In one embodiment a first die is formed overlying a substrate. A first wire is bonded to the first die and to a bond finger of the substrate, wherein the first wire is bonded to the bond finger with a first bond. A first stitch bump is formed overlying the first stitch bond, wherein the first stitch bump is formed from a molten ball of conductive material. A second die is formed overlying the first die. A second wire is bonded to the second die and to the first stitch bump, wherein the second wire is bonded to the first stitch bump with a second bond.

14 Claims, 9 Drawing Sheets

STITCH BUMP STACKING DESIGN FOR OVERALL PACKAGE SIZE REDUCTION FOR MULTIPLE STACK

TECHNICAL FIELD

The present disclosure relates generally to the field of semiconductor manufacturing and more specifically to the field of semiconductor miniaturization in stacked die configurations.

BACKGROUND

The trend in the semiconductor industry today is the production of ever increasingly more capable semiconductor components, while decreasing component size and total semiconductor package height. Stacked die configuration is a popular method to realize increased semiconductor device density. With the need to achieve ever smaller package sizes and thinner package heights being an ongoing driver, new die stacking methodologies are sought.

FIG. 1 is a cross-sectional view of a plurality of stacked dies. As illustrated in FIG. 1, a plurality of integrated circuit (IC) chips (i.e., dies) 120 are arranged in a stacked die configuration upon a substrate 110. In this embodiment, the stacked die configuration comprises four dies 120. However, other quantities of dies may be used. Interposed between the dies 120 are die spacers 124. A die spacer 124 provides a necessary space between two dies 120 to prevent the above die 120 from touching, shorting, or damaging bonding wires 130 below. In one embodiment, the die spacers 124 are silicon spacers. The dies 120 and die spacers 124 are attached to each other with adhesive layers 122. The bottom die 120 is attached to the substrate 120 with an adhesive layer 122. The bottom surface of each die 120 or spacer 124 may be laminated with an adhesive film during the manufacturing process, commonly at the wafer level. In other embodiments, the adhesive layer 122 can be an epoxy or liquid paste that is applied at the time of attachment. The adhesive layer 122 is then cured (e.g. baked) to complete the die attachment.

FIG. 2 illustrates a portion D of FIG. 1 shown in a top-down view. Each die 120 is electrically connected to the substrate 110 (e.g. a printed circuit board or other electronic system) by wires formed during a wire bonding process. As illustrated in FIGS. 1 and 2, the wire bonding process attaches connecting bond wires 130 between bonding pads 132 (not shown) on each die 120 to contact points 134 on bond fingers 136 on the substrate 110. The portion D of FIG. 1 illustrated in a top-down view in FIG. 2 comprises a bond finger 136 with a plurality of contact points 134 and attached bond wires 130. The wire bonding process begins by forming a first bond on the die. This first bond is forming by melting the end of a bond wire 130 to form a molten ball 138 on the bonding pad 132. After attaching the bond wire 130 to the die and providing a sufficient amount of slack in the bond wire 130, the wire bonding process finishes by pressing the bond wire 130 onto the contact point 134 to form a fish-tail shaped stitch bond 140. As illustrated in FIG. 2, with a plurality of stacked dies, a plurality of in-line contact points 134 are required for the plurality of stitch bonds 140 applied to each bond finger 136. As further illustrated in FIG. 3, there can also be a plurality of bonding pads 132 on each die 120 with a corresponding plurality of bond fingers 136.

During the wire bonding process, a wire bond machine welds the bond wires 130 between the bonding pads 132 and the contact points 134 utilizing ultrasonic, thermosonic or thermocompression bonding. As illustrated in FIGS. 1, 2, and 3, each die 120 has at least one plurality of bond wires 130 extending from bonding pads 132 to contact points 134. Each bond wire 130 has its own corresponding bonding pad 132 and contact point 134. However, as illustrated in FIG. 2, as die stacking increases (e.g., four dies), bond finger length must also increase to accommodate the additional bond wires connecting to the same bond finger 136 at additional contact points 134. The total bond finger length requirement is exacerbated by the need to provide a minimum space between contact points 134 to prevent damage to the already emplaced bond wires 130 during the wire bonding process. For example, while an exemplary single contact bond finger length can be 0.20 mm, an exemplary quadruple bond (in-line), as illustrated in FIG. 2, requires 0.56 mm. Thus, even as increasing levels of die stacking increases the density of the semiconductor device, the resulting increasing bond finger length requires an increase in semiconductor device package size.

SUMMARY OF THE INVENTION

This present invention provides a solution to the challenges inherent in stacked die configured semiconductor devices. In a method according to one embodiment of the present invention, a method for die stacking is disclosed. A first die is positioned overlying a substrate. A first wire is bonded to the first die and to a bond finger of the substrate, wherein the first wire is bonded to the bond finger with a first stitch bond. A first stitch bump is formed overlying the first stitch bond. A second die is positioned overlying the first die. A second wire is bonded to the second die and to the first stitch bump, wherein the second wire is bonded to the first stitch bump with a second stitch bond, wherein the second wire overlies the first stitch bump. Lastly, a second stitch bump is formed overlying the second stitch bond. In another embodiment of the present invention, a semiconductor device is disclosed. The semiconductor comprises: a substrate and a plurality of dies overlying the substrate, wherein the plurality of dies are in a stacked configuration. The semiconductor further comprises a plurality of bond wires, wherein each bond wire is attached to one of the plurality of dies and to a bond finger of the substrate. A plurality of bond wires is attached to the bond finger, wherein each bond wire of the plurality of bond wires is attached to the bond finger with a stitch bond. Lastly, the plurality of stitch bonds is in a stacked configuration with a stitch bump between each pair of stitch bonds.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1:
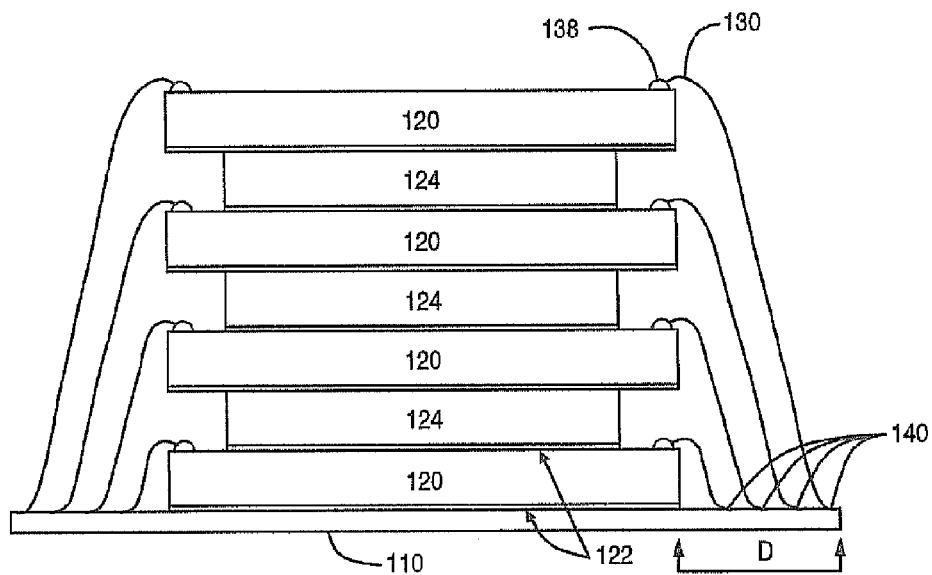
FIG. 1 illustrates a schematic cross-section of a semiconductor device according to the prior art exhibiting increased bond finger length.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system (e.g., multi-node computer system 10 of FIG. 1), or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in stacked-die configured semiconductor devices. Various embodiments of the present disclosure provide a reduced finger length by the formation of stacked fish-tail shaped stitch bonds. As discussed in detail below, after a first wire from a first die is stitch bonded to a bond finger, a molten ball of conductive material is formed, and herein referred to as a first stitch bump, overlying the first stitch bond. Thereafter, a second wire from a second die stacked atop the first die can be stitch bonded to the first stitch bump to form a second stitch bond overlying the first stitch bump, followed by a second stitch bump formed on the second stitch bond, and so forth.

Figure 4A:
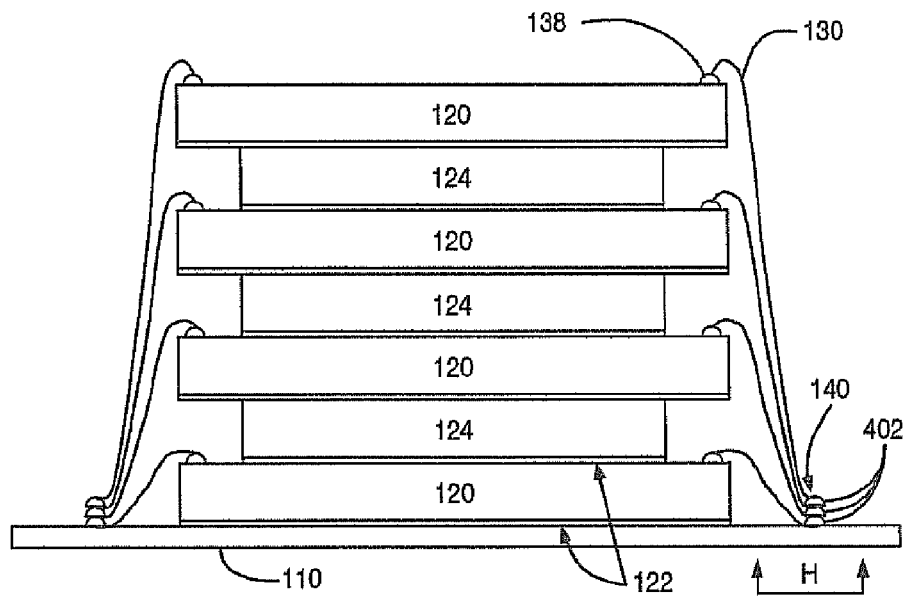
FIG. 4A illustrates a schematic cross-section of a semiconductor device in accordance with an embodiment of the present invention.

FIG. 4A is a cross-sectional view of a plurality of stacked dies according to an embodiment of the present invention. As illustrated in FIG. 4A, a plurality of integrated circuit (IC) chips (i.e., dies) 120 are arranged in a stacked die configuration upon a substrate 110. In this embodiment, the stacked die configuration comprises four dies 120. However, other quantities of dies may be used. Interposed between the dies 120 are die spacers 124. A die spacer provides a necessary space between two dies to prevent the above die from touching, shorting, or damaging bonding wires below. In one embodiment, the die spacers 124 are silicon spacers. The dies 120 and die spacers 124 are attached to each other with adhesive layers 122. The bottom die 120 is attached to the substrate 120 with an adhesive layer 122. The bottom surface of each die 120 or spacer 124 may be laminated with an adhesive film during the manufacturing process, commonly at the wafer level. In other embodiments, the adhesive layer 122 can be an epoxy or liquid paste. As illustrated in FIG. 4A, each die 120 and spacer 124 will have an adhesive layer 122 attached to it. The adhesive layer 122 is then cured (e.g. baked) to complete the die attachment.

Figure 5:
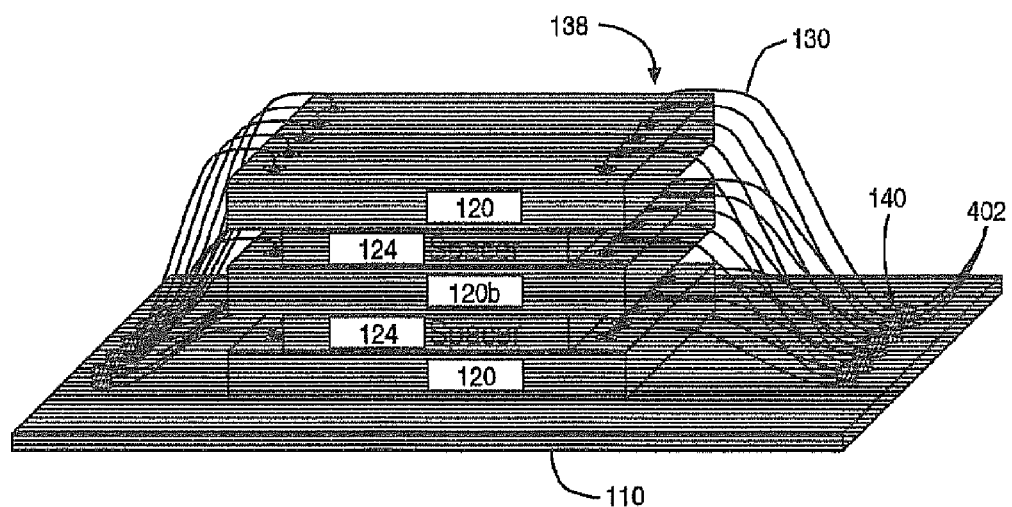
FIG. 5 illustrates a 3D view of a semiconductor device in accordance with an embodiment of the present invention.

Each die 120 is communicatively coupled to the substrate 110 (e.g. a printed circuit board or other electronic system) by wires formed during a wire bonding process. The wire bonding process utilizing ultrasonic, thermosonic or thermocompression bonding at a wire bonding station, begins by forming a molten ball 138 on a bonding pad 132 (not shown) by melting the end of the bond wire 130. Once the bond wire 130 has attached to the die 120, the mechanism will lift away from the bonding pad, and after forming a predetermined amount of slack, will bring the wire 130 down to the bond finger 136. The process continues by pressing the wire 130 onto the contact point 134 to form a flattened, fish-tail shaped stitch bond 140. As further illustrated in FIG. 5, there can also be a plurality of bonding pads 132 on each die 120 with a corresponding plurality of bond fingers 136 on the substrate 110, such that a plurality of bond wires 130 are coupled to each of the plurality of bond fingers 136.

Figure 4B:
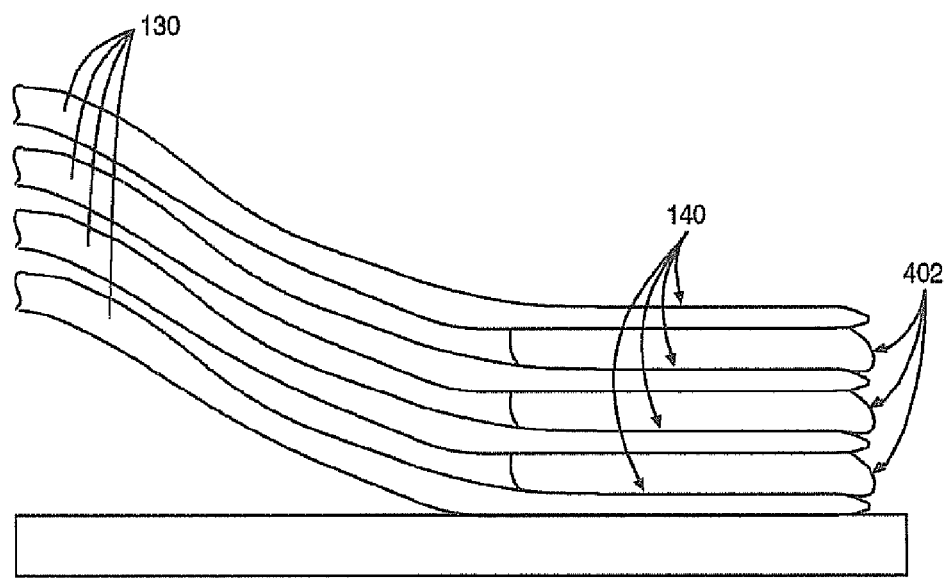
FIG. 4B illustrates a schematic cross-section of a portion of a semiconductor device in accordance with an embodiment of the present invention.

However, as described in detail below, rather than requiring a plurality of contact points 134 on each bond finger 136 for a plurality of stitch bonds 140, as required in FIG. 1, FIGS. 4A and 4B illustrate a stacked die embodiment requiring only a single contact point 134 for a plurality of stitch bonds 140. Each die 120 has at least one bond wire 130 extending from a bonding pad 132 to a contact point 134. However, rather than each bond wire 130 having its own corresponding bonding pad 132 and contact point 134, in an embodiment of the present invention, a plurality of bond wires 130 and their corresponding connecting stitch bonds 140 are stacked atop a single contact point 134. This stacking of stitch bonds 140 is made possible by interposing molten balls of conductive material between each stitch bond 140, as discussed below. The molten balls of conductive material are formed from heating the end of a conductive wire. The molten balls are herein referred to as stitch bumps 402.

Figure 2:
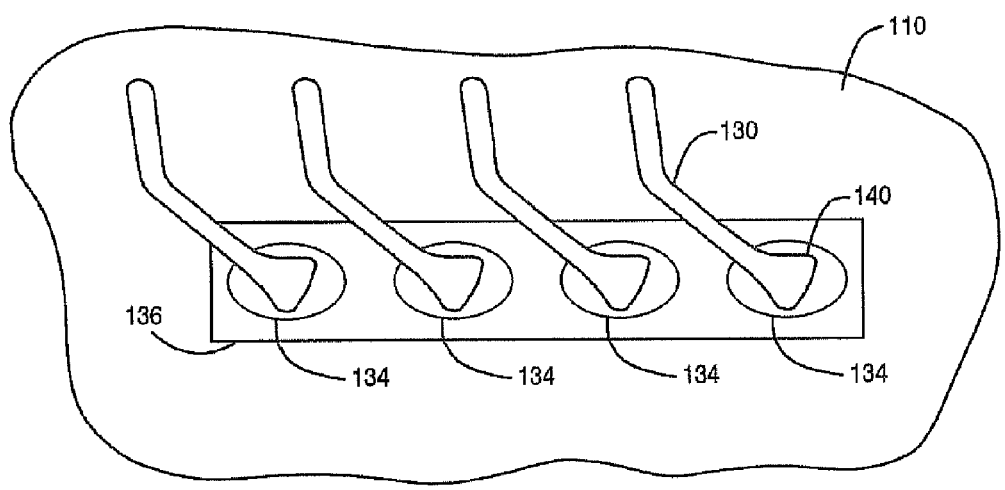
FIG. 2 illustrates a top-down view of a portion of FIG. 1 further illustrating increased bond finger length.
Figure 3:
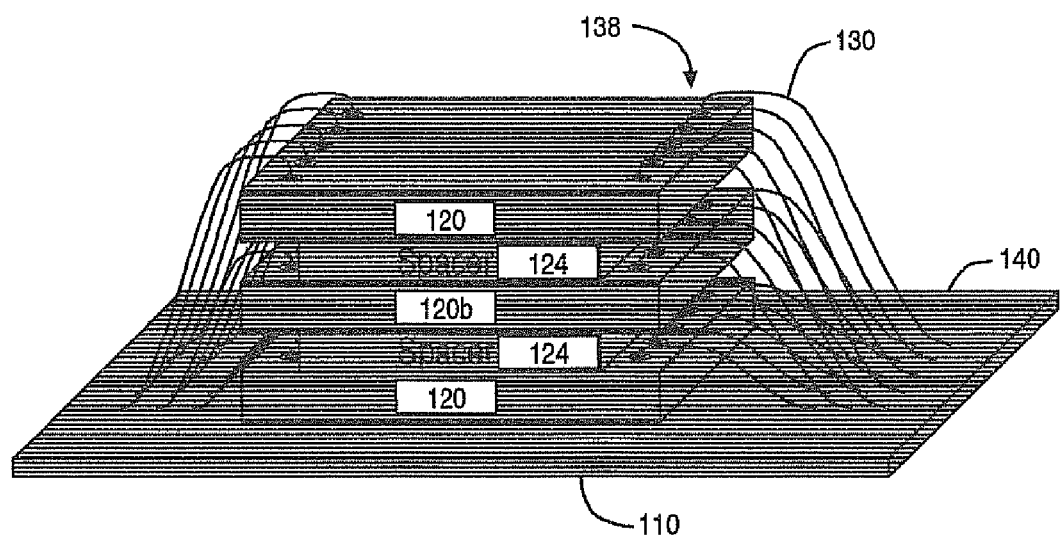
FIG. 3 illustrates a 3D view further illustrating a plurality of bond fingers.

Therefore, as illustrated in FIG. 4A, and further illustrated in FIG. 4B, after a first bond wire 130 is stitch bonded 140 to the contact point 134 of a bond finger 136, a first stitch bump 402 is formed to overlie the first stitch bond 140. The first stitch bump 402 is formed through the same process that forms the molten ball 138 on the contact pad 132, except the wire is cut off, leaving only the molten ball behind to form a stitch bump 402. After the first stitch bump 402 is formed, a second bond wire 130 is stitch bonded 140 to the top surface of the first stitch bump 402 to overlie the first stitch bump 402. Thereafter, a third stitch bump 402 is formed over the second stitch bond 140 and the process continues. Unlike embodiments as illustrated in FIG. 2, which see a corresponding bond finger length increase as die stacking increases, the bond finger length remains constant regardless of the number of bond wires stitch bonded to the bond finger 136. In other words, whether there is a single die or a stack of four dies, the bond finger length can remain at 0.20 mm. Thus, even as increasing levels of die stacking increases the density of the semiconductor device, the constant bond finger length further aids in the reduction of semiconductor device package size and increased density.

Figure 6:
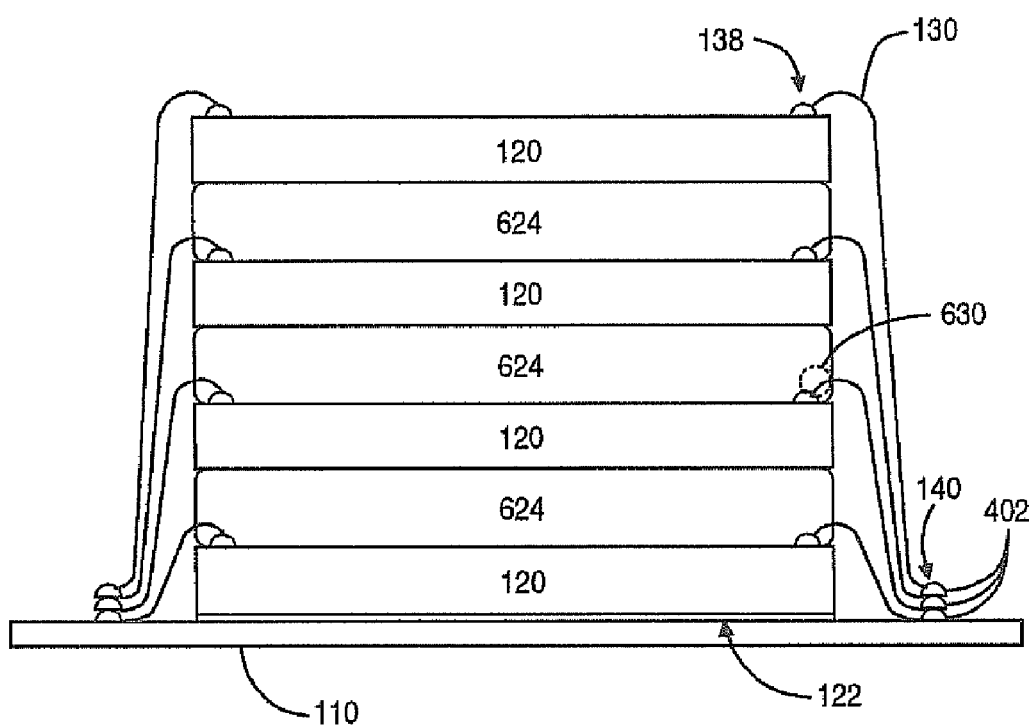
FIG. 6 illustrates a schematic cross-section of a semiconductor device in accordance with an embodiment of the present invention.

FIG. 6 is a cross-sectional view of a plurality of stacked dies according to another embodiment of the present invention. FIG. 6 is identical to FIG. 4 except that the spacers 124 and adhesive layers 122 have been replaced by film over wire (F.O.W.) layers 624. In an exemplary embodiment, the FOW layers 624 are formed of an organic adhesive. The FOW layers 624 can also be pre-laminated onto dies 120. Before placement of a die with a laminated FOW layer, the FOW layer will be heated to soften it. As illustrated in FIG. 6, when a softened FOW layer 624 is placed over a die 120, a portion of the bond wires 130 attached to the die 130 sink into the softened FOW layer 624 as the softened FOW layer 624 settles onto the upper surface of the lower die 120. This results in a portion 630 of the bond wire 130, as well as the attaching bond 138 to be embedded into an FOW layer 624 that overlies the die 120. With the spacers 124 replaced with FOW layers 624, the adhesion layers 122 can also be removed from the dies 120 except for the first die 120 where an adhesion layer 112 would still be used to attach the first die 120 to the substrate 110. The use of FOW layers 624, which allows the elimination of spacers 124 and adhesive layers 122, will further improve the density of the semiconductor device by reducing the overall package height.

Figure 7:
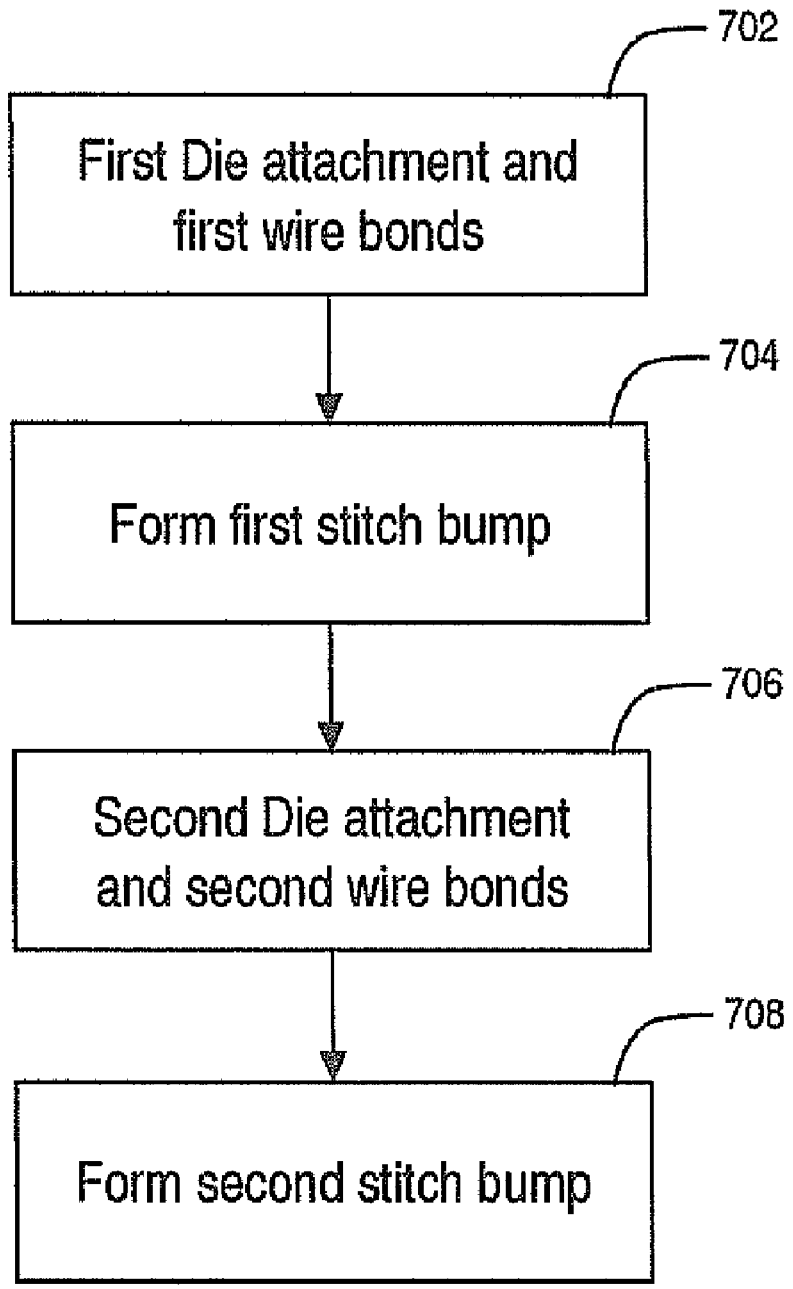
FIG. 7 illustrates a flow diagram, illustrating the steps to a method in accordance with an embodiment of the present invention.

FIG. 7 illustrates the steps to a process for attaching a plurality of dies 120 with their pluralities of bond wires 130 to a substrate 110. FIGS. 8A-8D further illustrate the stages of the manufacturing process and provide additional detail for the steps of FIG. 7.

Figure 8A:
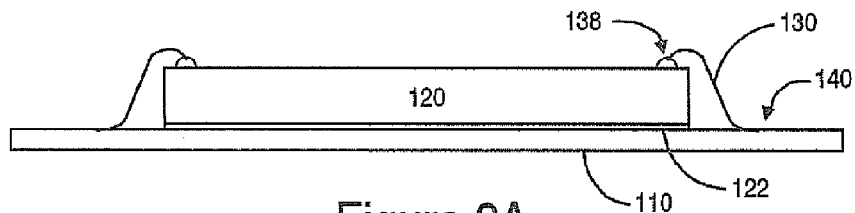
FIGS. 8A-8D illustrate schematic cross-sections of a semiconductor device in accordance with an embodiment of the present invention.

In step 702 of FIG. 7, a first die is attached followed by the formation of first wire bonds. Step 702 is further illustrated in FIG. 8A, where a first die 120 is attached to a substrate 110. The first die 120 is attached to the substrate 110 with an adhesion layer 122. As mentioned above, the adhesion layer 122 may be laminated to a die 120 in a previous step at the wafer level or attached to either the die 120 or underlying surface at the time of attachment. After attaching the first die 120 to the substrate 110, a plurality of bond wires 130 are each bonded to bonding pads 132 of the first die 120 and to corresponding contact points 134 of bond fingers 136 on the substrate 110. The bond wires 130 can be formed of any suitable conductive material (e.g., copper, silver, and gold). FIG. 8A illustrates two bond wires 130 bonded between the first die 120 and the substrate 110; however, any number of bond wires can be utilized. In other words, there can be one or more bonding pads on each die 120 for attaching bond wires 130. Each bond wire 130 is bonded to the first die 120 with a molten ball 138, also known as a "first bond," and to the contact point 134 with a stitch bond 140, also known as a "second bond." In other words, each bond wire is bonded to a die and a bond finger with a first and second bond.

In step 704 of FIG. 7, a first stitch bump is formed. Step 704 is further illustrated in FIG. 8B, where a first stitch bump 402 is formed to overlie the first stitch bond 140. As noted above, the first stitch bump 402 is formed by the same process that forms the molten ball 138 on the bonding pad 132 (i.e., the "first bond"). However, after forming the molten ball by melting a portion of wire, the wire is cut from the newly placed molten ball to form the first stitch bump 402.

Figure 8B:
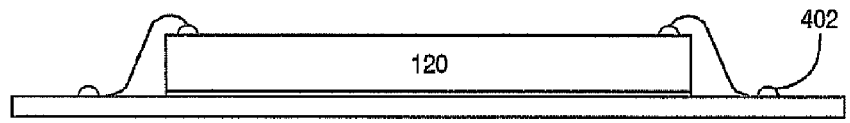
Figure 8C:
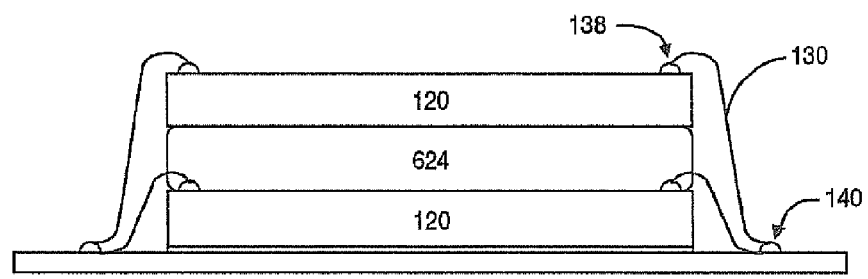
Figure 8D:
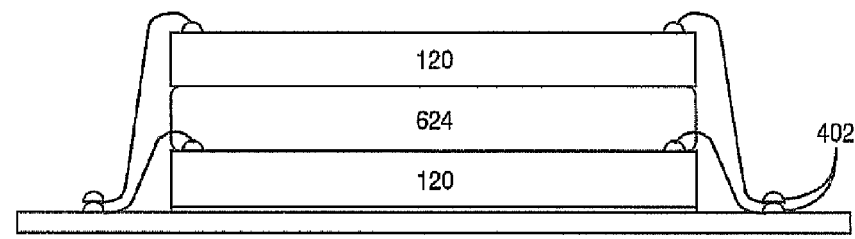

In step 706 of FIG. 7, a second die is attached followed by the formation of second wire bonds. Step 706 is further illustrated in FIG. 8C, where a film over wire (FOW) layer 624 and a second die 120 are positioned to overlie the first die 120. The FOW layer 624 may be applied to the first die 120 in a separate step or may be preapplied to the underside of the second die 120 such that the second die 120 and an attached FOW layer 624 are applied at the same time. After attaching the second die 120 and the FOW layer 624 to the first die 120, a second plurality of bond wires 130 are each bonded to bonding pads 132 of the second die 120 and to the top surface of corresponding first stitch bumps 402, such that second stitch bonds 140 are formed overlying the first stitch bumps 402. Each bond wire 130 is bonded to a bonding pad 132 on the second die 120 with a molten ball 138 and to the first stitch bump 402 with a second stitch bond 140, such that the second stitch bond 140 overlies the first stitch bump 402. FIG. 8C further illustrates two bond wires 130 bonded between the second die 120 and the substrate 110; however, any number of bond wires may be utilized. In other words, there can be one or more bonding pads on each die 120 for attaching bond wires 130.

In step 708 of FIG. 7, a second stitch bump is formed. Step 708 is further illustrated in FIG. 8D, where a second stitch bump 402 is formed over each second stitch bond 140 formed in step 706, such that each second stitch bump 402 overlies a second stitch bond 140. As illustrated in FIG. 8B and described above, the second stitch bump 402 is also formed by the same process that forms a molten ball 138 on a bonding pad 132. After forming the molten ball by melting a portion of the wire, the wire is cut from the newly placed molten ball to form the second stitch bump 402. The process may then be repeated for attaching additional dies 120 and their corresponding bond wires 130.

Figure 9:
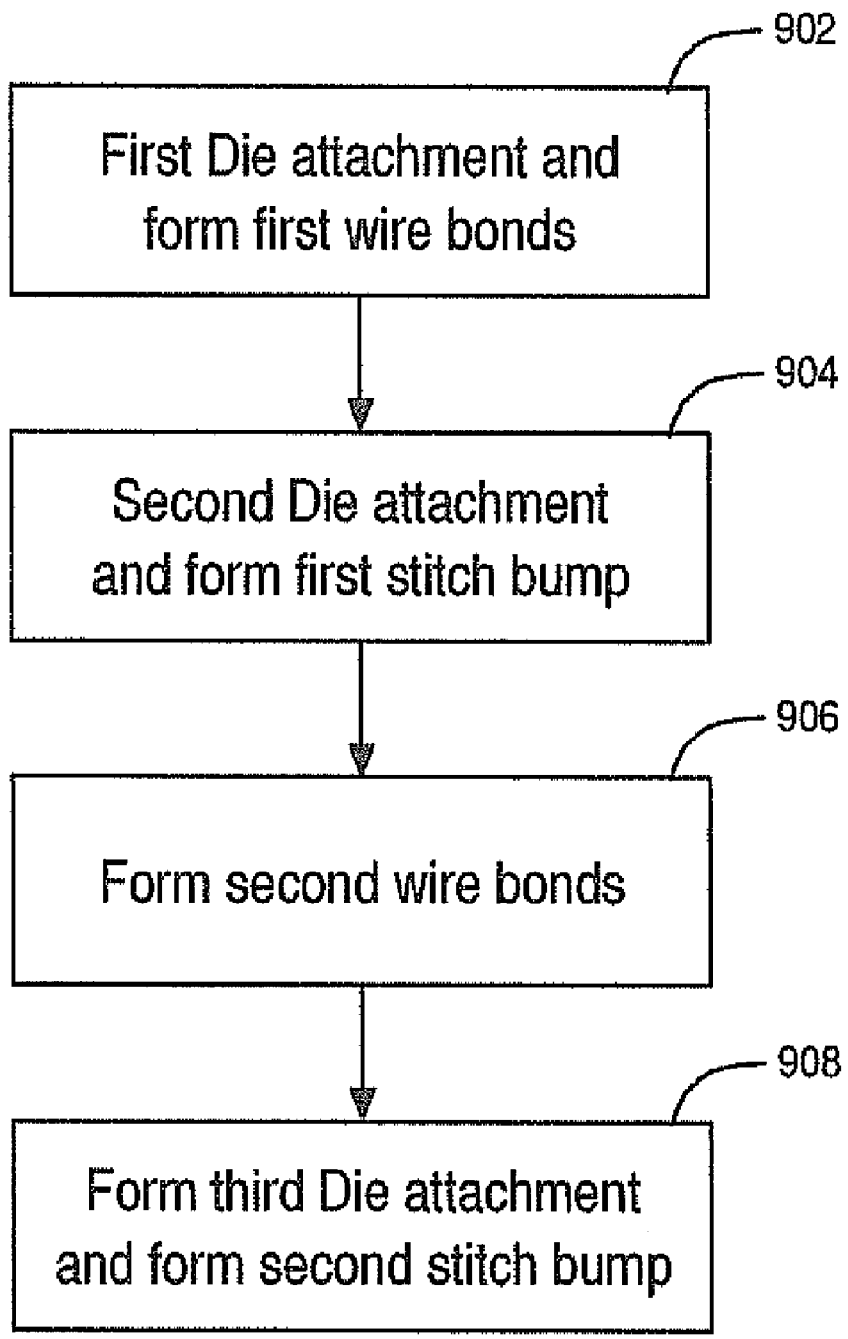
FIG. 9 illustrates a flow diagram, illustrating the steps to a method in accordance with an embodiment of the present invention.

FIG. 9 illustrates the steps to another process for attaching a plurality of dies 120 with their pluralities of bond wires 130 to a substrate 110. The steps of the process illustrated in FIG. 9 are preferred over the steps of the process illustrated in FIG. 7. By placing each stitch bump only after placing the next die, as discussed in detail below, a more robust manufacturing process is achieved. Because the stitch bump is not placed until after the next die is placed, there is less risk of damage to the stitch bump stack during the manufacturing process.

Figure 10A:
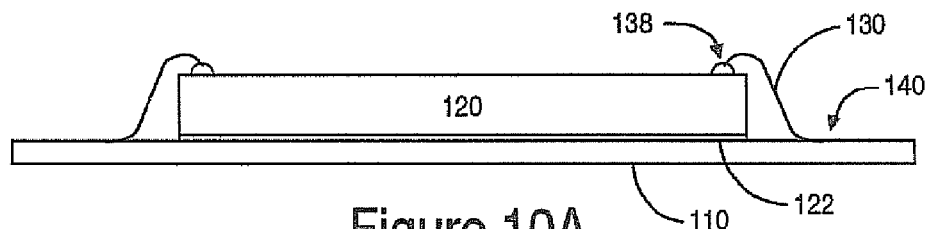
FIGS. 10A-10D illustrate schematic cross-sections of a semiconductor device in accordance with an embodiment of the present invention.
Figure 10B:
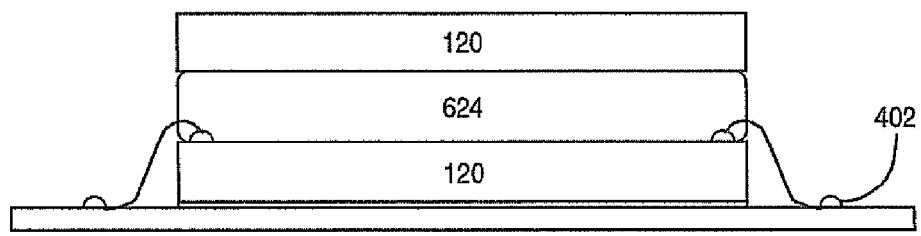

FIGS. 10A-10D further illustrate the stages of the manufacturing process and provide additional detail for the steps of FIG. 9. In step 902 of FIG. 9, a first die is attached, followed by the formation of first wire bonds. Step 902 is further illustrated in FIG. 10A, where a first die 120 is attached to a substrate 110. The first die 120 is attached to the substrate 110 with an adhesion layer 122. As mentioned above, the adhesion layer 122 may be laminated to a die 120 in a previous step at the wafer level or attached to either the die 120 or underlying surface at the time of attachment. After attaching the first die 120 to the substrate 110, a plurality of bond wires 130 are each bonded to bonding pads 132 of the first die 120 and to corresponding contact points 134 of bond fingers 136 on the substrate 110. The bond wires 130 can be formed of any suitable conductive material (e.g., copper, silver, and gold). FIG. 10A illustrates two bond wires 130 bonded between the first die 120 and the substrate 110; however, any number of bond wires may be utilized. In other words, there can be one or more bonding pads on each die 120 for attaching bond wires 130. Each bond wire 130 is bonded to the first die 120 with a molten ball 138, also known as a "first bond," and to the contact point 134 with a stitch bond 140, also known as a "second bond." In other words, each bond wire is bonded to a die and a bond finger with a first and second bond.

In step 904 of FIG. 9, a second die is attached followed by the formation of a first stitch bump. Step 904 is further illustrated in FIG. 10B, where a first film over wire (FOW) layer 624 and a second die 120 are placed over the first die 120. The first FOW layer 624 may be applied to the first die 120 in a separate step or may be preapplied to the second die 120 such that the second die 120 and an attached FOW layer 624 are applied at the same time. After attaching the second die 120 and the first FOW layer 624 to the first die 120, a first stitch bump 402 is formed on the first stitch bond 140. As noted above, the first stitch bump 402 is formed by the same process that forms the molten ball 138 on the bonding pad 132. However, after forming the molten ball by melting a portion of wire, the wire is cut from the newly placed molten ball to form the first stitch bump 402.

Figure 10C:
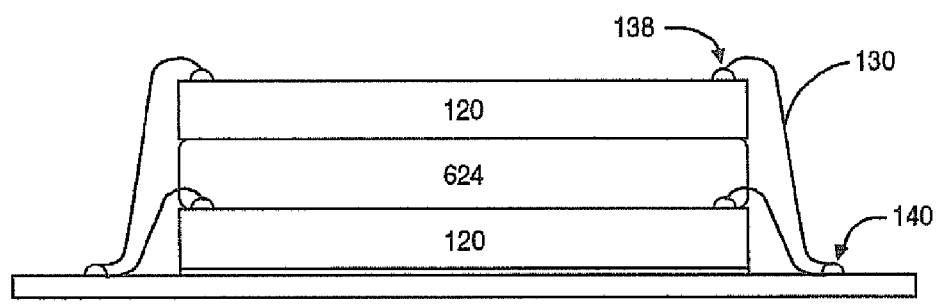
Figure 10D:
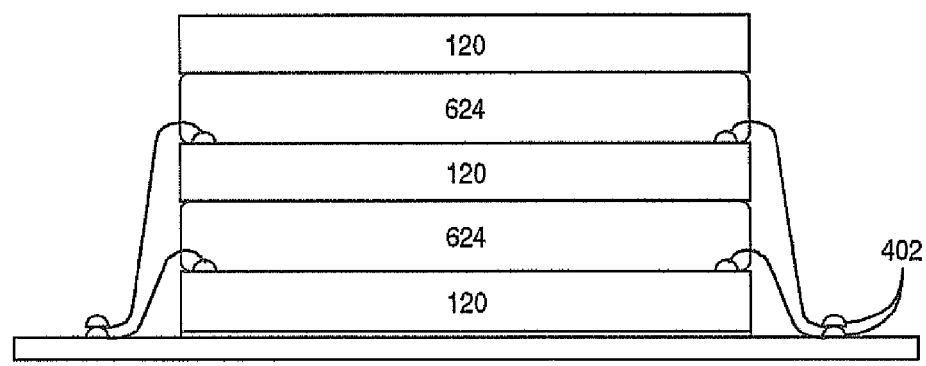

In step 906 of FIG. 9, second wire bonds are formed. Step 906 is further illustrated in FIG. 10C, where a second plurality of bond wires 130 are each bonded to bonding pads 132 of the second die 120 and to the top surface of corresponding first stitch bumps 402, such that second stitch bonds 140 are formed overlying the first stitch bumps 402. Each bond wire 130 is bonded to a bonding pad 132 on the second die 120 with a molten ball 138 and to the first stitch bump 402 with a second stitch bond 140. FIG. 10C illustrates two bond wires 130 bonded between the second die 120 and the substrate 110; however, any number of bond wires may be utilized. In other words, there can be one or more bonding pads on each die 120 for attaching bond wires 130.

In step 908 of FIG. 9, a third die is attached followed by the formation of a second stitch bump. Step 908 is further illustrated in FIG. 10D, where a second film over wire (FOW) layer 624 and a third die 120 are placed over the second die 120. The second FOW layer 624 may be applied to the second die 120 in a separate step or may be preapplied to the third die 120 such that the third die 120 and an attached FOW layer 624 are applied at the same time. After attaching the third die 120 and the second FOW layer 624 to the second die 120, a second stitch bump 402 is formed on the second stitch bond 140, which was formed on the first stitch bump 402. As noted above, the second stitch bump 402 is also formed by the same process that forms a molten ball 138 on a bonding pad 132. After forming the molten ball by melting a portion of wire, the wire is cut from the newly placed molten ball to form the second stitch bump 402. The process may then be repeated for attaching corresponding bond wires 130 to the third die 120 and substrate, and for attaching additional dies 120 and their corresponding bond wires 130.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for die stacking comprising:
    positioning a first die overlying a substrate;
    bonding a first wire to the first die and to a bond finger of the substrate, wherein the first wire is bonded directly to the bond finger with a first bond;
    forming a first stitch bump overlying the first bond, wherein the first stitch bump is formed from a molten ball of conductive material, and wherein the first stitch bump directly contacts the first bond;
    positioning a second die overlying the first die; and
    bonding a second wire to the second die and to the first stitch bump, wherein the second wire is bonded directly to the first stitch bump with a second bond, and wherein the second bond overlies the first stitch bump.

2. The method of claim 1, further comprising the step of positioning a die spacer overlying the first die prior to the step of positioning a second die, wherein the die spacer is positioned between the first die and the second die.

3. The method of claim 2, wherein the undersurfaces of the first die, die spacer, and second die are laminated with an adhesive layer.

4. The method of claim 1, further comprising the step of positioning a film over wire (FOW) layer overlying the first die prior to the step of positioning a second die, wherein the FOW is positioned between the first die and the second die.

5. The method of claim 4, wherein the undersurface of the first die is laminated with an adhesive layer.

6. The method of claim 1, wherein the first bond and the second bond are stitch bonds, and wherein stitch bonds have a fish-tail shape.

7. The method of claim 1, wherein the first wire and the second wire are bonded to the first die and the second die, respectively, by forming molten balls of conductive material.

8. A method for die stacking comprising:
    positioning a first die overlying a substrate;
    bonding a first wire to the first die and to a bond finger of the substrate, wherein the first wire is bonded directly to the bond finger with a first bond;
    positioning a second die overlying the first die;
    forming a first stitch bump overlying the first bond, wherein the first stitch bump is formed from a molten ball of conductive material, and wherein the first stitch bump directly contacts the first bond; and
    bonding a second wire to the second die and to the first stitch bump, wherein the second wire is bonded directly to the first stitch bump with a second bond, and wherein the second bond overlies the first stitch bump.

9. The method of claim 8, further comprising:
positioning a die spacer overlying the first die prior to the step of positioning a second die, wherein the die spacer is positioned between the first die and the second die.

10. The method of claim 9, wherein the undersurfaces of the first die, die spacer, and second die are laminated with an adhesive layer.

11. The method of claim 8, further comprising:
positioning a film over wire (FOW) layer overlying the first die prior to positioning the second die, wherein the first FOW is positioned between the first die and the second die.

12. The method of claim 11, wherein the undersurface of the first die is laminated with an adhesive layer.

13. The method of claim 8, wherein the first bond and the second bond are stitch bonds, and wherein stitch bonds have a fish tail shape.

14. The method of claim 8, wherein the first wire and the second wire are bonded to the first die and the second die, respectively, by forming molten balls of conductive material.

* * * * *